(12) United States Patent
Kubota et al.

(10) Patent No.: US 8,227,021 B2
(45) Date of Patent: Jul. 24, 2012

(54) METHOD OF MANUFACTURING PIEZOELECTRIC THIN FILM

(75) Inventors: Makoto Kubota, Kawasaki (JP);
 Motokazu Kobayashi, Yokohama (JP);
 Shinji Eritate, Kawasaki (JP); Fumio Uchida, Daito (JP); Kenji Maeda, Nakatsugawa (JP); Chiemi Shimizu, Hirakata (JP)

(73) Assignees: Canon Kabushiki Kaisha, Tokyo (JP);
 Fuji Chemical Co. Ltd., Osaka-shi (JP)

( * ) Notice: Subject to any disclaimer, the term of this patent is extended or adjusted under 35 U.S.C. 154(b) by 488 days.

(21) Appl. No.: 12/131,454

(22) Filed: Jun. 2, 2008

(65) Prior Publication Data
US 2008/0233277 A1 Sep. 25, 2008

Related U.S. Application Data

(62) Division of application No. 10/561,247, filed as application No. PCT/JP2005/003435 on Feb. 23, 2005, now Pat. No. 7,399,067.

(30) Foreign Application Priority Data

Feb. 27, 2004 (JP) ................. 2004-055479

(51) Int. Cl.
 *B05D 5/12* (2006.01)
 *H01L 41/22* (2006.01)
(52) U.S. Cl. ...................... 427/100; 29/25.35
(58) Field of Classification Search .................. 427/100; 29/25.35
 See application file for complete search history.

(56) References Cited

U.S. PATENT DOCUMENTS

| | | | |
|---|---|---|---|
| 5,657,063 A | 8/1997 | Takahashi | 347/69 |
| 6,402,304 B1 | 6/2002 | Qiu et al. | 347/68 |
| 6,409,935 B1 * | 6/2002 | Miyazawa et al. | 252/62.9 PZ |
| 6,523,943 B1 * | 2/2003 | Fukui | 347/68 |
| 6,565,997 B2 | 5/2003 | Kashiwaya | 428/701 |
| 6,609,783 B1 | 8/2003 | Koyama et al. | |
| 6,616,258 B2 | 9/2003 | Maeda | |
| 6,688,729 B1 | 2/2004 | Imanaka et al. | |
| 6,883,901 B2 * | 4/2005 | Murai et al. | 347/68 |
| 6,945,633 B2 | 9/2005 | Imanaka et al. | |
| 6,960,424 B2 | 11/2005 | Miyagawa et al. | |
| 7,033,001 B2 * | 4/2006 | Fujii et al. | 347/68 |

(Continued)

FOREIGN PATENT DOCUMENTS

EP 1 033 250 9/2000

(Continued)

OTHER PUBLICATIONS

Kumar et al., "Lead Zirconate Titanate Films by Rapid Thermal Processing," Applied Physics Letters, vol. 58, No. 11, Mar. 18, 1991, pp. 1161-1163.

*Primary Examiner* — Brian K Talbot
(74) *Attorney, Agent, or Firm* — Fitzpatrick, Cella, Harper & Scinto

(57) ABSTRACT

There are disclosed a piezoelectric thin film having less non-uniform portions and holding satisfactory piezoelectric characteristics, a method of manufacturing the film, a piezoelectric element using the piezoelectric thin film, and an ink jet system recording head using the piezoelectric element. In the piezoelectric thin film of perovskite crystals formed on a substrate by a sol-gel process and represented by a general formula $Pb_{(1-x)}La_x(Zr_yTi_{1-y})O_3$ (where $0 \leq x < 1$, $0.05 \leq y \leq 1$), a film thickness of the thin film is 1000 nm or more and 4000 nm or less, and a difference between a maximum value and a minimum value of y in an arbitrary portion of the thin film is 0.05 or less.

5 Claims, 6 Drawing Sheets

U.S. PATENT DOCUMENTS

| | | | |
|---|---|---|---|
| 2001/0011743 A1* | 8/2001 | Arita et al. | 257/314 |
| 2004/0124482 A1 | 7/2004 | Kobayashi et al. | |
| 2005/0082943 A1 | 4/2005 | Kubota et al. | |
| 2007/0099121 A1 | 5/2007 | Kubota et al. | |

FOREIGN PATENT DOCUMENTS

| | | |
|---|---|---|
| EP | 1 045 460 | 10/2000 |
| JP | 5-7029 | 1/1993 |
| JP | 9-92897 | 4/1997 |
| JP | 10-139594 | 5/1998 |
| JP | 10-290035 | 10/1998 |
| JP | 10290035 | * 10/1998 |
| JP | 2000-174351 | 6/2000 |
| JP | 2001-203401 | 7/2001 |
| JP | 2002-084012 | 3/2002 |
| JP | 2003-81694 | 3/2003 |

* cited by examiner

METHOD OF MANUFACTURING PIEZOELECTRIC THIN FILM

This application is a division of U.S. patent application Ser. No. 10/561,247, filed Dec. 19, 2005, now allowed, which is a national stage of PCT/JP2005/003435, filed Feb. 23, 2005.

TECHNICAL FIELD

The present invention relates to a piezoelectric thin film, a method of manufacturing the film, a piezoelectric element using a piezoelectric thin film of the present invention, and an ink jet system recording head. The present invention relates particularly to a perovskite type crystal piezoelectric thin film in which composition in the thin film is set to be uniform and a crystal system of crystals constituting the thin film is set to be the same to thereby enhance piezoelectric performance.

BACKGROUND ART

A piezoelectric element usually comprises lower and upper electrodes, and ferroelectric or paraelectric crystallized piezoelectric ceramic held between these electrodes, As to the piezoelectric ceramic, lead zirconate titanate (hereinafter referred to as "PZT"), or "PLZT type" in which lanthanum is added to PZT is general. For example, a ferroelectric article using PZT has been described in Applied Physics Letters 1991, vol. 58, No. 11, pp. 1161 to 1163.

There is an ink jet system recording head as an application example of a piezoelectric element using a thin-film piezoelectric ceramic. A film thickness of about 1 μm to 25 μm is necessary for the piezoelectric thin film for use in this application to develop an electromechanical conversion function (pressure which promotes displacement). Uniformity of the film has been demanded in order to control the displacement with good precision.

Examples of a process of manufacturing a metal oxide type piezoelectric thin film include a sputtering process, a metalorganic chemical vapor deposition process (MOCVD process), a sol-gel process and the like. In the sol-gel process, a solution or a dispersion solution containing a hydrolytic compound of each component metal constituting a raw material, a partial hydrolytic material, or a partial polycondensation material is applied to a substrate. After the coated film is dried, the film is heated in air to form a film of metal oxide. Furthermore, the film is fired at a temperature which is not less than the crystallization temperature of metal oxide to thereby form the piezoelectric thin film.

As the hydrolytic metal compound which is a raw material, metal alkoxide, or an organic metal compound such as a partial hydrolysis material or partial polycondensation material has been generally used. In the sol-gel process, the piezoelectric thin film can be formed most inexpensively and easily.

As a method which is similar to the sol-gel process, there is a metalorganic decomposition process (MOD process). In the MOD process, a pyrolytic metalorganic compound (metal complex and metalorganic acid salt), for example, a solution containing a metal β-diketone complex or carboxylate is applied to a substrate. The solution is heated, for example, in air or oxygen, evaporation of a solvent in a coating film, and pyrolysis of a metal organic compound are caused to thereby form a film of metal oxide. Furthermore, the film is fired at a temperature which is not less than the crystallization temperature, and the film is crystallized. In the present invention, the sol-gel process, MOD process, and a mixed process are referred to as the "sol-gel process".

Moreover, an ink jet system printer head using a piezoelectric element formed into a film by the sol-gel process has been described. For example, in Japanese Patent Application Laid-Open No. H9-92897, Japanese Patent Application Laid-Open No. H10-139594, and Japanese Patent Application Laid-Open No. H10-290035, a method has been described in which the sol-gel process is utilized, sol containing a piezoelectric material is applied to a lower electrode a plurality of times, a heating process is repeated, and accordingly the piezoelectric thin film of the piezoelectric element for use in an ink jet system printer head is formed.

However, a crystal system or orientation has differed, or a composition ratio of a metal compound has fluctuated depending on a portion in a piezoelectric film such as a PZT film formed by the sol-gel process until now. Therefore, it cannot be easily said that an electric or piezoelectric performance of the piezoelectric film can be controlled to be optimum.

SUMMARY OF THE INVENTION

The present invention has been developed to solve the problem, and an object is to provide a piezoelectric thin film whose uniformity of a composition in the piezoelectric thin film is high and whose crystal system is the same and which holds a satisfactory piezoelectric characteristic, a method of manufacturing the film, a piezoelectric element using this piezoelectric thin film, and an ink jet system recording head using this piezoelectric element.

To solve the problem, according to the present invention, there is provided a piezoelectric thin film of perovskite crystals formed on a substrate by a sol-gel process and represented by a general formula $Pb_{(1-x)}La_x(Zr_yTi_{1-y})O_3$ (where $0 \leq x < 1$, $0.05 \leq y \leq 1$), wherein a film thickness of the piezoelectric thin film is 1000 nm or more and 4000 nm or less, and a difference between a maximum value and a minimum value of y in an arbitrary portion of the piezoelectric thin film is 0.05 or less.

Moreover, to solve the problem, according to the present invention, there is provided a piezoelectric thin film of perovskite crystals formed on a substrate by a sol-gel process and represented by a general formula $Pb_{(1-x)}La_x(Zr_yTi_{1-y})O_3$ (where $0 \leq x < 1$, $0.05 \leq y \leq 1$), wherein a film thickness of the piezoelectric thin film is 1000 nm or more and 4000 nm or less, the surface of the piezoelectric thin film contains crystal grains having an equivalent circle diameter of 200 nm or more, and crystal grains having an equivalent circle diameter of 40 nm or less, and the number of the crystal grains observed in the surface of the piezoelectric thin film and having an equivalent circle diameter of 40 nm or less is 5% or more with respect to the total number of the crystal grains observed in the surface of the piezoelectric thin film.

Furthermore, to solve the problem, according to the present invention, there is provided a method of manufacturing a piezoelectric thin film, comprising: a step of repeating (a) a step of applying a raw material solution containing titanium, zirconium, and lead on a substrate to thereby form a coating layer, and (b) a step of firing the coating layer at a temperature of 400° C. or more and 700° C. or less to thereby form a piezoelectric layer having a layer thickness of 150 nm or more and 400 nm or less every time the coating layer is formed a plurality of times to thereby form the piezoelectric thin film in which a plurality of piezoelectric layers are stacked, wherein titanium concentration of a raw material solution for use in forming the piezoelectric layer of the first layer is set to be higher than that of a raw material solution for use in forming a last piezoelectric layer.

Additionally, to solve the problem, according to the present invention, there is provided a piezoelectric element comprising: a piezoelectric thin film held between lower and upper electrodes, the piezoelectric thin film comprising the piezoelectric thin film according to any of the above-described inventions.

Moreover, to solve the problem, according to the present invention, there is provided a piezoelectric actuator comprising: the piezoelectric element of the present invention, which is a driving source.

Furthermore, to solve the problem, according to the present invention, there is provided an ink jet system recording head comprising: an ink discharge port; a pressure chamber communicating with the ink discharge port; a vibration plate constituting a part of the pressure chamber; and a piezoelectric element for imparting vibration to a vibration plate disposed outside the pressure chamber, the ink discharge port discharging ink in the pressure chamber by a volume change in the pressure chamber generated by the vibration plate, wherein the piezoelectric element comprises the piezoelectric element of the present invention.

According to the present invention, there can be provided a piezoelectric thin film having high uniformity of a composition and having a large piezoelectric constant. According to the present invention, there can be provided a method capable of manufacturing the piezoelectric thin film having the high uniformity of the composition and having the large piezoelectric constant. According to the present invention, there can be provided the piezoelectric element causing large displacement. Furthermore, according to the present invention, there can be provided an ink jet system recording head which is capable of easily controlling an ink discharge amount and which is superior in frequency follow-up property.

DESCRIPTION OF THE PREFERRED EMBODIMENT

An embodiment of the present invention will be described hereinafter.

Figure 1:
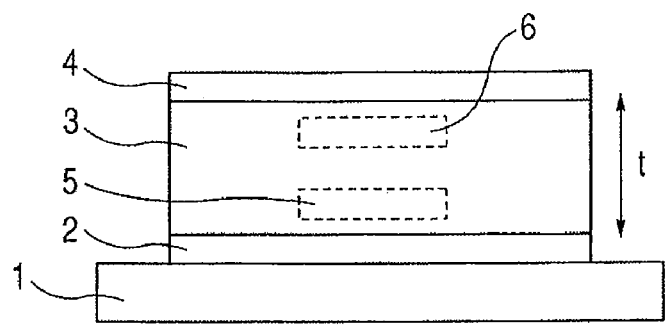
FIG. 1 is a longitudinal sectional view schematically showing one example of an embodiment of a piezoelectric element according to the present invention.

FIG. 1 is a longitudinal sectional view schematically showing one example of the embodiment of a piezoelectric element in the present invention. In the drawing, reference numeral 1 denotes a substrate which supports a thin film, 2 denotes a lower electrode, 3 denotes a piezoelectric thin film of the present invention, 4 denotes an upper electrode, and 5, 6 denote arbitrary regions in the vicinity of the substrate and a surface layer.

A material of the substrate 1 is not especially limited, but preferably the material is not deformed or melted in a firing step performed usually at 850° C. or less, especially at 400° C. or more and 700° C. or less in a method of manufacturing the piezoelectric thin film in the present invention. When an ink jet system recording head of the present invention is manufactured using the piezoelectric element of the present invention, the substrate 1 may also serve as a pressure chamber substrate for forming a pressure chamber. For example, for this purpose, a semiconductor substrate formed of silicon (Si) or tungsten (W), or a heat-resistant stainless steel (SUS) substrate is preferably used, but ceramics such as zirconia, alumina, and silica may be used. A plurality of types of these materials may be combined, or the materials may be stacked to thereby form a multilayered constitution. The materials may be combined and stacked with metal layers such as platinum and palladium.

Each of the lower electrode 2 and the upper electrode 4 is constituted of a conductive layer having a layer thickness of about 5 to 2000 nm. The material is not especially limited, and any material usually for use in the piezoelectric element may be used. Examples of the material include metals such as Ti, Pt, Ta, Ir, Sr, In, Sn, Au, A, Fe, Cr, Ni, and oxides of these metals. Each of the lower electrode 2 and the upper electrode 4 may be formed of one of the types, or two or more types may be laminated. The metal or oxide may be formed by a sol-gel process, sputtering process, evaporating process or the like. Both the lower electrode and the upper electrode may be patterned in desired shapes, and used.

In FIG. 1, a length "t" designated by a double arrow indicates a film thickness of the piezoelectric thin film 3 of the present invention, and a value of "t" is 1000 nm or more and 4000 nm or less in the present invention. In a case where a film shape is not flat, and the film thickness is not determined by one value, an average value of the thickness between two electrodes substantially functioning as piezoelectric members when formed into elements may be a value in the range. When the film thickness of the piezoelectric thin film 3 is set to 1000 nm or more, a displacement amount or force required for the piezoelectric element is obtained. When the thickness is set to 4000 nm or less, densification of the element can be expected.

Moreover, the piezoelectric thin film 3 of the present invention is a piezoelectric thin film of perovskite crystals formed on the substrate 1 by the sol-gel process and represented by a general formula $Pb_{(1-x)}La_x(Zr_yTi_{1-y})O_3$. Furthermore, x described in the general formula takes a value of a range of $0 \leq x < 1$, and y takes a value of a range of $0.05 \leq y \leq 1$. More preferably, x takes a value of a range of $0 \leq x < 0.2$, and y takes a value of a range of $0.3 \leq y \leq 0.7$. When the value of the composition x of La in composition of Pb and La is set to the above-described range, and the value of the composition y of Zr in the composition of Zr and Ti is set to the above-described range, perovskite crystals having high piezoelectricity are obtained.

Doping may be performed with a micro amount of elements other than Pb, La, Zr, and Ti. When the doping is performed, examples of elements usable as dopants include Ca, Sr, Ba, Sn, Th, Y, Sm, Ce, Bi, Sb, Nb, Ta, W, Mo, Cr, Co, Ni, Fe, Cu, Si, Ge, Sc, Mg, and Mn. The doping amount is 0.05 or less in an atomic ratio at a time when the total number of metal atoms in the general formula $Pb_{(1-x)}La_x(Zr_yTi_{1-y})O_3$ (where $0 \leq x < 1$, $0.05 \leq y \leq 1$) is 2.

Moreover, a difference between a maximum value and a minimum value of the composition y of zirconium measured in arbitrary portions of the piezoelectric thin film 3 of the present invention, for example, the region 5 in the vicinity of the substrate and the region 6 in the vicinity of the surface layer, is 0.05 or less. When the difference of the composition y of zirconium in the piezoelectric thin film is small, the uniformity of the perovskite crystals increases, and piezoelectricity increases. Conversely, when the difference is 0.05 or more, partial density and crystallinity in the piezoelectric thin film become non-uniform, and the piezoelectricity is adversely affected. As an example of a method of specifying the composition y of zirconium in the arbitrary portion in the piezoelectric thin film, observation of a section of the piezoelectric thin film by a scanning electronic microscope and X-ray composition analysis are both used.

Furthermore, a crystal system in the arbitrary portion of the piezoelectric thin film 3 of the present invention is more preferably the same. When the crystal system in the piezoelectric thin film is the same, linearity of a piezoelectric effect is enhanced, because directions of polarization moments of crystal grains corresponding the piezoelectric thin film are aligned. In this case, as to a crystal system, a tetragonal system in which a (100) face is oriented in a film thickness direction, or a rhombohedral system in which a (111) face is oriented in the film thickness direction is further preferable. In this orientation, since a direction of a polarization moment is remarkably close to a deformation direction of a piezoelectric article, a deformation amount increases.

An orientation state of the piezoelectric thin film can be easily confirmed from the detection angle and the strength of a diffraction peak in X-ray diffraction measurement (e.g., a $2\theta/\theta$ process) for general use with respect to the piezoelectric thin film. For example, in a diffraction chart obtained from the piezoelectric thin film whose (100) face or (111) face is oriented in the film thickness direction in the present invention, the strength of the diffraction peak detected at an angle corresponding to the (100) face or the (111) face is larger than a total of the strengths of the peaks at which angles corresponding to other faces are detected.

Moreover, the crystal system in the arbitrary portion of the piezoelectric thin film can be confirmed by the use of both transmission electronic microscope observation in a sheared section of the piezoelectric thin film and electron ray diffraction measurement with respect to a microscope image.

Figure 2:
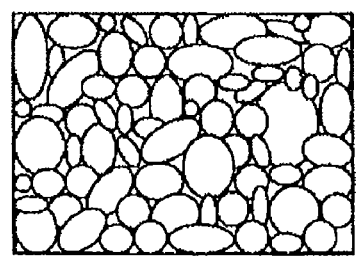
FIG. 2 is a schematic diagram of crystal grains on the surface of a piezoelectric thin film according to an example of the embodiment of the present invention, schematically showing that the surface of the piezoelectric thin film is packed by crystal grains having various sizes.

FIG. 2 is a schematic diagram of crystal grains on the surface of the piezoelectric thin film according to an example of the embodiment of the present invention, schematically showing that the surface of the piezoelectric thin film is packed by crystal grains having various sizes. The piezoelectric thin film of the present invention is a piezoelectric thin film of perovskite crystals formed by a sol-gel process and represented by the general formula $Pb_{(1-x)}La_x(Zr_yTi_{1-y})O_3$ (where $0 \leq x < 1$, $0.05 \leq y \leq 1$), and the film thickness is 1000 nm or more and 4000 nm or less. Additionally, crystal grains having an equivalent circle diameter of 200 nm or more, and those having an equivalent circle diameter of 40 nm or less are observed in the surface. The crystal grains having the equivalent circle diameter of 200 nm or more enhance piezoelectric characteristics of the piezoelectric thin film. On the other hand, the crystal grains having the equivalent circle diameter of 40 nm or less fall among larger crystal grains, and enhance a packing property to thereby enhance an insulation property of the piezoelectric thin film.

The "equivalent circle diameter" in the present invention refers to a "projection area equivalent circle diameter" generally referred to in a microscope observation method, and means a diameter of a perfect circle having an area equal to a projection area of the crystal grains. In the present invention, a method of measuring the equivalent circle diameter is not especially limited. For example, the diameter can be calculated using image processing software, for example, "Luzex" (Nireco Co., tradename) with respect to an electronic microscope photograph image obtained by enlarging and photographing the surface of the piezoelectric thin film by about 20,000 to 50,000 times with the scanning electronic microscope.

The crystal grains having the equivalent circle diameter of 200 nm or more are preferably columnar crystals grown from the substrate. It can be easily judged that the crystal grains are grown from the substrate, when the section of the piezoelectric thin film is observed, for example, by the transmission electronic microscope, and it is observed that the columnar grown crystal grains contact the substrate or the electrode on the substrate. When the crystal grains having the equivalent circle diameter of 200 nm or more are the columnar crystals grown from the substrate, the piezoelectric property of the piezoelectric thin film is further enhanced.

Moreover, the number of the crystal grains having the equivalent circle diameter of 200 nm or more, or the crystal grains having the equivalent circle diameter of 40 nm or less is more preferably 5% of the total number of the crystal grains observed in the surface of the piezoelectric thin film, and the crystal grains having the equivalent circle diameter of 200 nm or more further preferably occupy 7% or more. Usually, these crystal grains preferably occupy 80% or less in total. When the number of the crystal grains having the equivalent circle diameter of 200 nm or more or the crystal grains having the equivalent circle diameter of 40 nm or less is 5% or more, the piezoelectric property and insulating property of the piezoelectric thin film are further enhanced. On the other hand, when the number of the crystal grains having the equivalent circle diameter of 40 nm or less is less than 5%, gaps formed in a grain boundary of larger crystal grains cannot be buried, and therefore enhancement of the insulating property of the film cannot be expected. The number of the crystal grains having the equivalent circle diameter, and a value of a ratio of them with respect to all the crystal grains can be obtained, when the surface of the piezoelectric film is photographed with a scanning electronic microscope, and, for example, "Luzex" (Nireco Co., tradename) is used.

Furthermore, the crystal grains observed in the surface of the piezoelectric thin film preferably have an equivalent circle diameter of 1000 nm or less. When crystal grains having an equivalent circle diameter exceeding 1000 nm are included, the gaps increase. As a result, since smaller crystal grains cannot fill in the gaps, the insulating property of the film drops. When the crystal grains having the equivalent circle diameter exceeding 1000 nm are included, there is possibility that the performance of piezoelectric film is deteriorated by high-density processing of a scale below 1000 nm.

Additionally, the peak value of an equivalent circle diameter distribution of the crystal grains observed in the surface of the piezoelectric thin film is preferably 50 nm or more and 200 nm or less. When the peak value of the equivalent circle diameter distribution is 50 nm or less, the piezoelectric characteristic of the piezoelectric thin film drops. When the peak value of the equivalent circle diameter distribution is 200 nm or more, the insulating property of the piezoelectric thin film drops. The distribution of the equivalent circle diameters can also be obtained, when the surface of the piezoelectric film is photographed with the scanning electronic microscope, and image processing software, for example, "Luzex" (Nireco Co., tradename) is used with respect to the obtained image.

Moreover, with regard to the crystal grains observed in the surface of the piezoelectric thin film, the surfaces of the adjacent crystal grains closely contact each other. In the present invention, a state "the surfaces of the crystal grains closely contact each other" indicates a state in which two or more adjacent crystals contact each other without any gap or another material therebetween. When the crystal grains closely contact one another, the piezoelectric characteristic of the piezoelectric thin film of the present invention is enhanced. When voids are disposed between the adjacent crystal grains, piezoelectric strain is partially absorbed by the voids, and therefore the piezoelectric characteristic of the piezoelectric thin film drops. When other materials such as lead oxide are disposed between the adjacent crystal grains, residual strain or insulating property drop is caused. In the present invention, a method of observing adjacent states of the crystal grains is not especially limited. For example, presence of the voids or other materials can be judged from an electronic microscope photograph image obtained by enlarging and photographing the surface of the piezoelectric thin film by about 200,000 to 400,000 times with the transmission electronic microscope. Additionally, when an energy-dispersive X-ray spectroscopy (sometimes referred to as EDX) is applied during observation with the transmission electronic microscope, a metal composition in a micro domain is seen, and therefore the presence of other materials can be exactly judged.

Next, a method of manufacturing the piezoelectric thin film according to the present invention will be described.

The piezoelectric thin film of the present invention is manufactured by a sol-gel process having: a step of applying a solution containing at least titanium, zirconium, and lead or a dispersion solution (sometimes referred to as a raw material solution) onto a substrate to thereby form a coating layer; and a step of firing the coating layer at a temperature of 400° C. or more and 700° C. or less every time the layer is formed to thereby form a piezoelectric layer having a layer thickness of 150 nm or more and 400 nm or less.

The raw material solution of the piezoelectric thin film applied onto the substrate contains at least titanium, zirconium, and lead. When lanthanum is contained in the piezoelectric thin film, a compound of lanthanum may be contained in the raw material solution. A micro amount of a compound of metals other than these metals may be added for a purpose of performance enhancement.

Examples of the metal compound contained in the raw material solution include a hydrolytic or pyrolytic metalorganic compound. Metal alkoxide of the above-described metals, organic acid salt, and a metal complex such as β-diketone complex are typical examples. As to the metal complex, not only amine complex but also other various complexes are usable. Examples of β-diketone include acetyl acetone (=2,4-pentane dione), heptafluorobutanoylpivaloyl methane, dipivaloyl methane, trifluoro acetyl acetone, benzoyl acetone, and the like.

As to examples of the metalorganic compound preferable as a raw material, examples of a lead compound and a lanthanum compound include organic acid salt such as acetate (lead acetate, lanthanum acetate), and metalorganic alkoxide such as diisopropoxy lead. As the titanium compound, metalorganic alkoxide is preferable such as tetraethoxy titanium, tetraisopropoxy titanium, tetra n-butoxy titanium, tetraisobutoxy titanium, tetra tert-butoxy titanium, and dimethoxy diisopropoxy titanium, and organic acid salt or metalorganic complex is also usable. There are examples of the zirconium compound in the same manner as in the titanium compound. Other metal compound examples are also similar to the above-described examples, but are not limited to the above-described examples. The above-described metal compounds may be combined and used. It is to be noted that as the organic metal compound of the raw material, in addition to the above-described compound containing one type of metal, a composite metalorganic compound containing two or more component metals may be used.

The metalorganic compounds for use as the raw materials of component metals are dissolved or dispersed together in an appropriate solvent, and a raw material solution containing a precursor of composite metalorganic oxide (oxide containing two or more metals) forming the piezoelectric thin film is prepared. The solvent for use in preparing the raw material solution is appropriately selected from various known solvents in consideration of dispersing and coating properties.

Examples of the solvent for use in preparing the raw material solution include: alcohol-based solvents such as methanol, ethanol, n-butanol, n-propanol, and isopropanol, ether-based solvent such as tetrahydrofuran, and 1,4-dioxane; cellosolve-based solvents such as ethyl cellosolve; amide-based solvents such as N,N-dimethyl formamide, N,N-dimethyl aceto amide, and N-methylpyrrolidone-based solvent; and nitrile-based solvents such as acetonitrile. Among them, the alcohol-based solvent is preferably used. An amount of the solvent for use in preparing the raw material solution in the present invention is not especially limited. A solvent amount is adjusted in such a manner that a metal solid content concentration is about 15 mass % to 30 mass %, one coating layer is formed, and it is preferably easy to set the layer thickness of the piezoelectric layer formed by firing the coating layer to 150 nm or more and 400 nm or less.

A ratio of each metalorganic compound contained in the raw material solution may be substantially equal to a composition ratio in the piezoelectric thin film to be manufactured $Pb_{(1-x)}La_x(Zr_yTi_{1-y})O_3$ (where $0 \leq x < 1$, $0.05 \leq y \leq 1$). Additionally, in the piezoelectric thin film manufactured by applying (coating) the raw material solution a plurality of times, the piezoelectric layer formed in the vicinity of the substrate is different from that formed in the vicinity of the surface layer in thermal history received in a film forming process, and therefore composition gap occurs. To solve this problem, when coating the coating layer in the vicinity of the substrate, a raw material solution containing a titanium compound more than the target ratio is prepared and used. When coating the coating layer in the vicinity of the surface layer, a raw material solution containing a zirconium compound more than the target ratio is prepared and used, and therefore the piezoelectric thin film is obtained without any fluctuation of composition. Additionally, a total content of zirconium and titanium components is preferably kept to be constant through a raw material solution group for use in forming the film. Additionally, a total amount ratio of the zirconium and titanium components included in a raw material solution group for use in forming a series of piezoelectric layers is preferably set to be substantially equal to a composition ratio of the piezoelectric thin film intended to be manufactured. In general, a lead component has high volatility, and lead is sometimes lost by evaporation in the firing step. Therefore, lead slightly excessively exists, for example, by 2 to 40 mol % in view of this loss. A degree of loss of lead differs with the type of film forming conditions of the lead compound, and can be obtained by an experiment.

The raw material solution for use in the present invention preferably contains at least one of 1,8-diazabicyclo[5.4.0]-7-undecene (sometimes referred to as DBU), 1,5-diazabicyclo [4.3.0]non-5-en (sometimes referred to as DBN), and 1,4-diazabicyclo[2.2.2]octane (sometimes referred to as DABCO) as a stabilizer. The stabilizer bonds a metal-oxygen-metal bond loosely as a whole. When a content of the stabilizer in the raw material solution is excessively small, an improving effect by addition of the stabilizer is not sufficiently obtained. When the content is excessively large, there occurs a problem that viscosity rises and film forming property is inferior. Therefore, the content is preferably usually a concentration of 0.005 times mol or more and 5.0 times mol or less with respect to a total mol number of metal atoms, especially 0.05 times mol or more and 2.5 times mol or less. A plurality of types of 1,8-diazabicyclo[5.4.0]-7-undecene, 1,5-diazabicyclo[4.3.0]non-5-en, and 1,4-diazabicyclo [2.2.2]octane may be used together.

They may be used as a compound of salt combined with acid. Concretely, formate, octylate and the like may be used.

Moreover, as another stabilizer, β-diketones (e.g., acetyl acetone, heptafluorobutanoylpivaloyl methane, dipivaloyl methane, trifluoro acetyl acetone, benzoyl acetone, etc.); ketonic acids (e.g., aceto acetate, propionyl acetate, benzoyl acetate, etc.); lower alkyl esters such as ethyl, propyl, butyl and the like of these ketonic acids; oxy acids (e.g., lactic acid, glycolic acid, α-oxybutyric acid, salicylic acid, etc.); lower alkyl esters, oxy ketones of these oxy acids (e.g., diacetone alcohol, acetoin, etc.); α-amino acids (e.g., glycine, alanine, etc.); and alkanol amines (e.g., diethanol amine, triethanol amine, monoethanol amine, etc.) and the like, which have heretofore been used, may be used together.

The amount of the stabilizer for use in the present invention is usually 0.05 times mol or more and 5 times mol or less, preferably 0.1 times mol or more and 1.5 times mol or less with respect to a total mol number of metal atoms in a case where at least one of 1,8-diazabicyclo[5.4.0]-7-undecene, 1,5-diazabicyclo[4.3.0]non-5-en, and 1,4-diazabicyclo [2.2.2]octane is used together with the stabilizer which has heretofore been used. In this case, an added amount of the conventional stabilizer for combined use is usually 0.01 times mol or more and 20 times mol or less, preferably 0.05 times mol or more and 10 times mol or less with respect to 1,8-diazabicyclo[5.4.0]-7-undecene, 1,5-diazabicyclo[4.3.0] non-5-en, and 1,4-diazabicyclo[2.2.2]octane.

In a method of manufacturing a piezoelectric thin film of the present invention, a piezoelectric thin film is usually formed on the lower electrode of the substrate having the lower electrode on the surface. As a method of applying the raw material solution in the method of manufacturing the piezoelectric thin film of the present invention, known applying methods are usable such as spin coating, dip coating, bar coating, and spray coating. A relative humidity in this case is preferably 60% or less. When the humidity is 60% or more, hydrolysis quickly proceeds in the raw material solution applied on the substrate, and deposit is unfavorably seen in the coating layer.

The layer thickness of the fired piezoelectric layer formed by applying the raw material solution once is 150 nm or more and 400 nm or less. When the layer thickness of the fired piezoelectric layer formed by applying the material once is 150 nm or less, the number of times of coating for obtaining the piezoelectric thin film having a desired film thickness increases. Therefore, a difference of heat history between the vicinity of the substrate and that of the surface layer enlarges, and film quality is adversely affected. On the other hand, when the layer thickness of the fired piezoelectric layer formed by one-time application is 400 nm or more, epitaxial crystal growth in a layer thickness direction is inhibited. This layer thickness can be controlled, when changing the concentration and application conditions of the raw material solution. The conditions can be obtained by experiments. For example, when the raw material solution having a solid content concentration of 20 to 25 mass % is applied at 2000 rpm by a spin coating process, and fired, a piezoelectric layer having a layer thickness of about 200 to 330 nm is formed every coating. The coating and firing steps are repeated three to ten times, until a desired film thickness of, for example, 1000 to 4000 nm, of the piezoelectric thin film is obtained. A last firing step is more preferably performed in a range of 600° C. to 700° C.

In a plurality of times of coating steps, a raw material solution excessively containing a titanium component with respect to a desired composition ratio is used in a first coating step, and a raw material solution excessively containing a zirconium component is preferably used in a final coating step. More preferably, as the coating and firing step is repeated, the raw material solution containing less titanium components is gradually applied. Since the titanium component amount is reduced every coating, composition fluctuation caused by the difference of the heat history between the coating layers is reduced, and film quality is enhanced.

A drying step is more preferably performed between the coating step and the firing step. The drying step is performed usually at a temperature of 250° C. or less. In the drying and firing steps, a drier, hot plate, tubular furnace, electric furnace and the like are usable.

Figure 3:
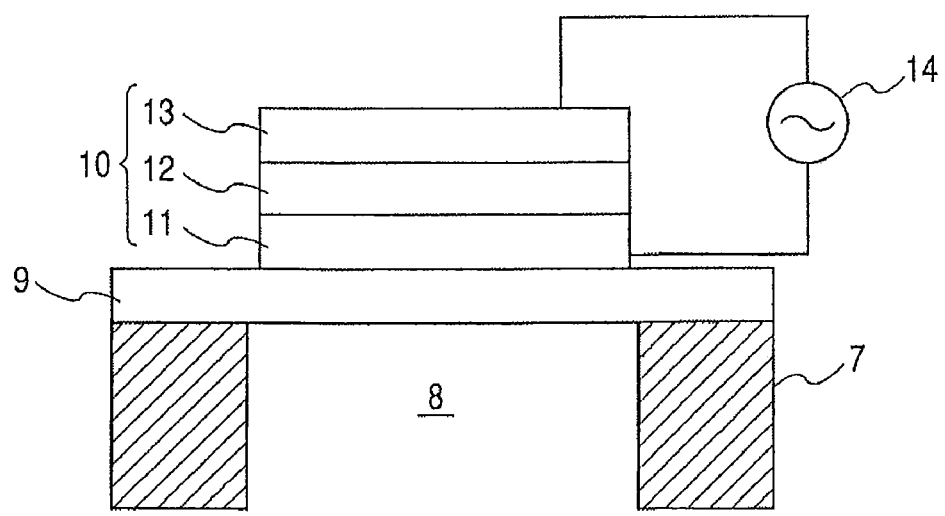
FIG. 3 is an enlarged vertical sectional view schematically showing a part of an ink jet system recording head in which the piezoelectric element of the present invention is used in an actuator.

FIG. 3 is an enlarged longitudinal sectional view schematically showing a part of an ink jet system recording head in which the piezoelectric element of the present invention is used in an actuator. A constitution of this ink jet system recording head is similar to a conventional constitution, and comprises an actuator of the present invention including a head base 7, a vibration plate 9, a piezoelectric element 10, and a power supply 14. The piezoelectric element 10 has a structure in which a piezoelectric thin film 12 is formed on the surface of a lower electrode 11, an upper electrode 13 is formed on the surface, and the piezoelectric film 12 is held between the lower electrode 11 and the upper electrode 13.

In the head base 7, a large number of ink nozzles (not shown) for discharging ink, a large number of ink paths (not shown) individually communicating with the ink nozzles, and ink chambers 8 which are a large number of pressure chambers individually communicating with the respective ink paths are formed. The vibration plate 9 is attached in such a manner as to cover the whole upper surface of the head base 7, and all upper surface openings of all the ink chambers 8 of the head base 7 are closed by the vibration plate 9. Each piezoelectric element 10 for imparting a vibration driving force to the vibration plate 9 is formed individually corresponding to each ink chamber 8 on the vibration plate 9. Moreover, when a voltage is applied to the desired selected piezoelectric element 10 by the power supply 14 of the actuator, the piezoelectric element 10 is deformed, and the vibration plate 9 of the corresponding portion is vibrated. Accordingly, a volume of the ink chamber 8 of the portion corresponding to the vibration of the vibration plate 9 changes, and ink is pushed out of the ink nozzle through the ink path to thereby perform printing.

EXAMPLES

The present invention will be described hereinafter more concretely in accordance with examples, but the present invention is not limited to the following examples.
(Manufacturing Examples 1 to 15 of Raw Material Solution)

As a raw material solution for forming a piezoelectric thin film, a raw material solution whose metal composition was represented by Pb/La/Zr/Ti=1+v/0.01/0.52+w/0.48−w (where $0 \leq v \leq 0.2$, $-0.1 \leq w \leq 0.1$) and which had a metal composition shown in Table 1 was prepared as follows.

As a compound of Pb and La, lead acetate hydrate and lanthanum acetate hydrate are mixed by an amount corresponding to a metal amount shown in Table 1, heated, and dehydrated. A stabilizer shown in Table 1 and 1-methoxy-2-propanol (10 mol) were mixed, heated, stirred, and reacted. Thereafter, as a compound of Zr and Ti, tetra n-butoxyzirconium, and tetraisopropoxytitanium were added by an amount corresponding to the metal amount shown in Table 1, further heated, and reacted, and raw material metal compounds were mutually combined. Next, water (4.5 mol) and ethanol (5.0 mol) were added, and hydrolytic reaction was performed. Thereafter, acetic acid (4.0 mol) and acetyl acetone (0.7 mol) were added. Thereafter, solvents with 100° C. or less boiling point was completely evaporated, then diethylene glycol monoethyl ether was added, concentration was adjusted in such a manner that metal oxide concentration converted into the above composition formula was 23 mass %, and the raw material solution was prepared.

TABLE 1

| Manufacturing example | Pb (mol) | La (mol) | Zr (mol) | Ti (mol) | DBU (mol) | DBN (mol) | DABCO (mol) |
|---|---|---|---|---|---|---|---|
| 1 | 1.1 | 0.01 | 0.42 | 0.58 | 1.4 | 0 | 0 |
| 2 | 1.1 | 0.01 | 0.47 | 0.53 | 1.4 | 0 | 0 |
| 3 | 1.1 | 0.01 | 0.52 | 0.48 | 1.4 | 0 | 0 |
| 4 | 1.1 | 0.01 | 0.57 | 0.43 | 1.4 | 0 | 0 |
| 5 | 1.1 | 0.01 | 0.62 | 0.38 | 1.4 | 0 | 0 |
| 6 | 1.2 | 0.01 | 0.42 | 0.58 | 0 | 0.8 | 0 |
| 7 | 1.2 | 0.01 | 0.47 | 0.53 | 0 | 0.8 | 0 |
| 8 | 1.2 | 0.01 | 0.52 | 0.48 | 0 | 0.8 | 0 |
| 9 | 1.2 | 0.01 | 0.57 | 0.43 | 0 | 0.8 | 0 |
| 10 | 1.2 | 0.01 | 0.62 | 0.38 | 0 | 0.8 | 0 |
| 11 | 1.05 | 0.01 | 0.42 | 0.58 | 0 | 0 | 0.1 |
| 12 | 1.05 | 0.01 | 0.47 | 0.53 | 0 | 0 | 0.1 |
| 13 | 1.05 | 0.01 | 0.52 | 0.48 | 0 | 0 | 0.1 |
| 14 | 1.05 | 0.01 | 0.57 | 0.43 | 0 | 0 | 0.1 |
| 15 | 1.05 | 0.01 | 0.62 | 0.38 | 0 | 0 | 0.1 |

(Manufacturing Example 16 of Raw Material Solution)

A raw material solution was prepared for comparison with respect to the present invention as follows.

Lead acetate 3 hydrate (1.15 mol) and lanthanum acetate hydrate (0.01 mol) were dispersed in 2-methoxy ethanol, water was removed by azeotropic distillation, tetraisopropoxytitanium (0.48 mol), and tetra-n-butoxyzirconium (0.52 mol) were added, and reflowed. Thereafter, water (5 mol) was added, finally 2-methoxyethanol was added, concentration was adjusted in such a manner that metal oxide concentration converted into the above-described composition formula was 10 mass %, and the raw material solution was prepared.

Example 1

(Manufacturing Example of Piezoelectric Thin Film and Piezoelectric Element)

A piezoelectric thin film was formed on the surface of a platinum layer of a multilayered substrate comprising Pt/Ti/$SiO_2$/Si using the raw material solutions of Manufacturing Examples 1, 2, 3, 4, and 5 described above.

First, the raw material solution of Manufacturing Example 1 was applied onto the multilayered substrate by a spin coater (2000 rpm) This coating layer was heated and dried for ten minutes with a hot plate at 250° C., solvent was removed, thereafter the layer was fired for 20 minutes by an electric furnace at 650° C., and a piezoelectric layer which was a first layer was formed. Next, the raw material solution of Manufacturing Example 2 was applied onto the piezoelectric layer which was the first layer by a spin coater (2000 rpm), and a piezoelectric layer was formed as a second layer in the same manner as in the first layer. Thereafter, piezoelectric layers which were third, fourth, and fifth layers were formed using the raw material solutions of Manufacturing Examples 3, 4, and 5 in the same manner. Finally, the whole substrate was fired at 700° C. for 40 minutes, and crystallized to thereby obtain a piezoelectric thin film A1.

With respect to the surface and sheared section of the piezoelectric thin film A1, particle shape observation, film thickness measurement, X-ray composition analysis, and electron ray diffraction measurement were performed using a scanning electronic microscope and transmission electronic microscope. The film thickness of the piezoelectric thin film A1 obtained by observation of the sheared section was 1500 nm (300 nm per layer). When the X-ray composition analysis was performed with respect to the sheared section, a Zr/Ti ratio of a portion in the vicinity of the substrate was 0.54/0.46, and a Zr/Ti ratio of a portion in the vicinity of the surface layer was 0.51/0.49. Since an intermediate value was obtained in composition analysis in another portion, a difference between a maximum value and minimum value of y-value of the piezoelectric thin film A1 was judged as 0.03. Additionally, when electron ray diffraction measurement was performed in the sheared section, it was seen that a (100) face had a tetragonal perovskite crystal structure oriented in a film thickness direction in any portion of the piezoelectric thin film A1.

Figure 4A:
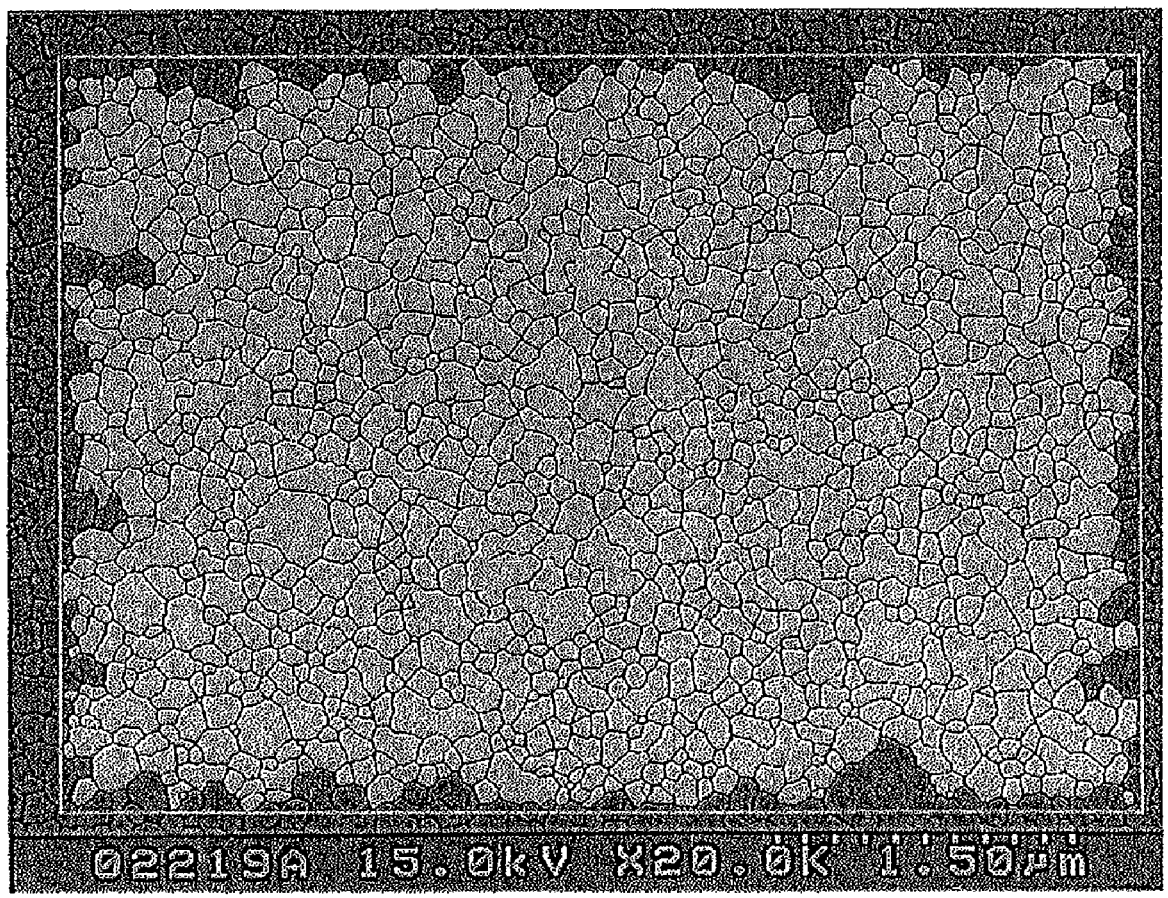
FIG. 4A is an electronic microscope photograph of the surface of a piezoelectric thin film A1 of Example 1 by a scanning electronic microscope.
Figure 4B:
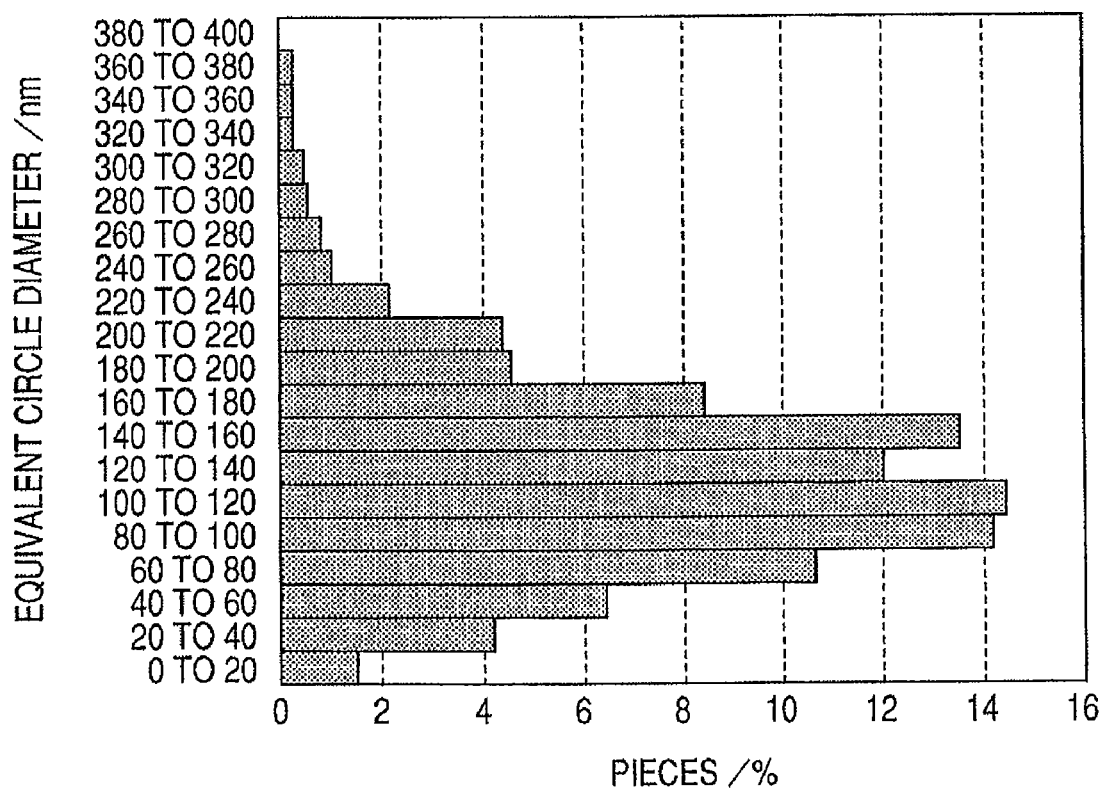
FIG. 4B is a graph showing an equivalent circle diameter distribution obtained by processing a crystal grain image.

Moreover, an image was analyzed with image processing software "Luzex" of Nireco Co. with respect to a scanning electronic microscope photograph image of the surface of the piezoelectric thin film A1, an equivalent circle diameter of each crystal grain was calculated, and a particle diameter distribution of crystal grains was obtained. Obtained results are shown in FIGS. 4A and 4B. According to a measurement result of this particle diameter distribution, it was observed that crystal grains having an equivalent circle diameter of 200 nm or more existed by 10%, and crystal grains having an equivalent circle diameter of 40 nm or less existed by 5.6% in the surface layer of the piezoelectric thin film A1. Equivalent circle diameters of all crystal grains were 1000 nm or less, and a peak of the distribution was in a range of 80 to 160 nm.

Furthermore, by observation of the sheared section with the transmission electronic microscope, it was confirmed that the crystal grains having the equivalent circle diameter of 200 nm or more were columnar crystals grown from the substrate.

Figure 10:
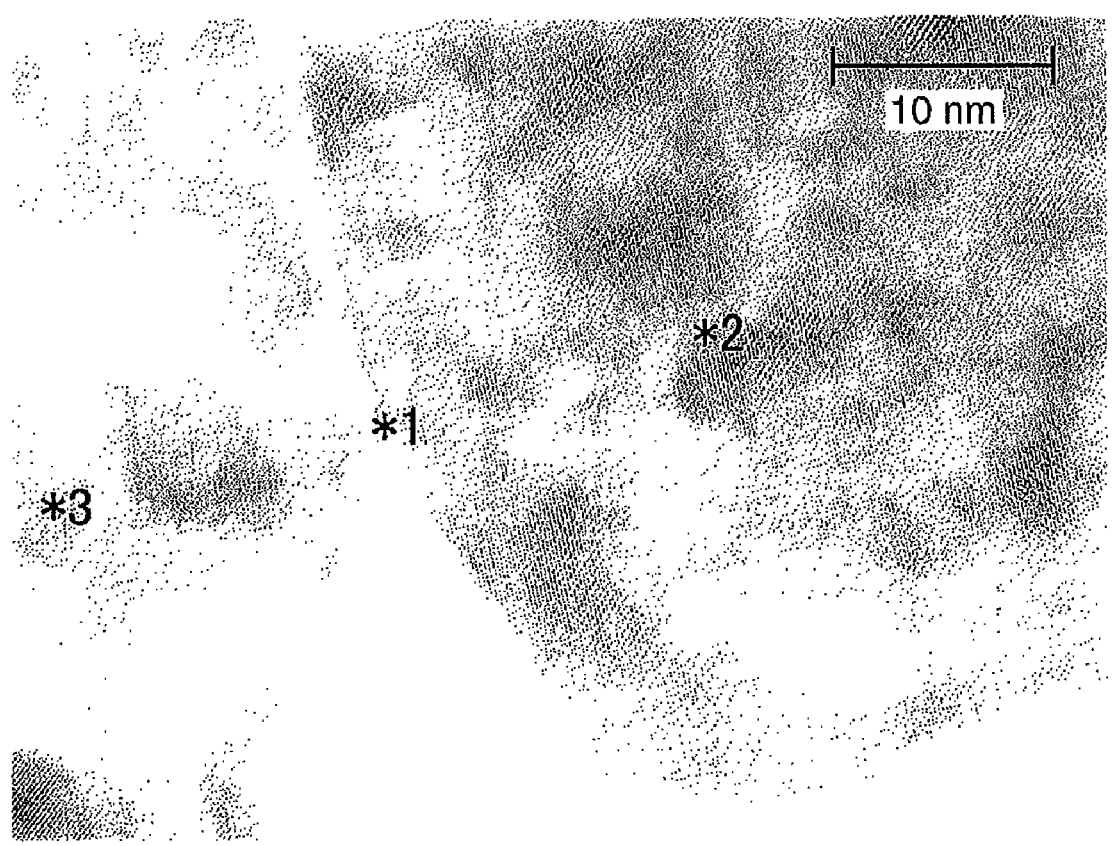
FIG. 10 is an electronic microscope photograph of the surface of the piezoelectric thin film A1 of Example 1 by a transmission electronic microscope, and *1, *2, *3 in the drawing indicate measurement positions in energy-dispersive X-ray spectroscopy.

Moreover, a surface portion of the piezoelectric thin film A1 was thinned by an ion milling process, and a microscope image was photographed with a transmission electronic microscope HF-2000 (manufactured by Hitachi Ltd.; tradename). Obtained results are shown in FIG. 10. According to this photographed image, an adjacent region (grain boundary) of the crystal grains is in completely close contact, and any presence of voids or other materials was not recognized. Furthermore, an energy-dispersive X-ray spectroscopy was applied to three portions: a certain crystal grain (*1 of FIG. 10); an adjacent crystal grain (*2); and a grain boundary (*3) between the crystal grains, to thereby obtain each metal composition. Results are shown in Table 2. Units are element %, and a total of the metal components is regarded as 100%

TABLE 2

| Measurement point | Pb component | Zr component | Ti component |
|---|---|---|---|
| *1 | 46.22% | 33.52% | 20.26% |
| *2 | 47.10% | 31.99% | 20.91% |
| *3 | 50.57% | 31.74% | 17.69% |

According to the measurement results, a grain boundary portion (*3) of both crystal grains exhibited a composition similar to that of each crystal grain (*1, *2). Accordingly, it has has been found that another material does not exist in the grain boundary portion.

Next, a gold thin film layer was formed in an upper portion of the piezoelectric thin film A1 by a sputtering process to thereby obtain a piezoelectric element A2 of the present invention. The gold thin film layer of the piezoelectric element was assumed as the upper electrode, a platinum layer of the multilayered substrate was assumed as the lower electrode, and a dielectric constant of the piezoelectric thin film of the piezoelectric element A2 was measured using an impedance/gain phase analyzer SI1260 (manufactured by Solartron Co.; trade name). The film had a specific dielectric constant of 1000 or more in a frequency region of 10 to 10000 Hz. Moreover, hysteresis was measured using a hysteresis measurement device HVS-6000 (manufactured by Radiant Co.; trade name). A hysteresis curve peculiar in a ferroelectric member was observed in which spontaneous polarization reversed by changing a drive field to be positive/negative. A residual polarization value +Pr indicated 20 $\mu C/cm^2$ after a voltage of 15 V was applied.

This hysteresis characteristic is usable as a storage unit. When a plurality of piezoelectric elements is disposed, and a voltage can be individually applied, a memory can be constituted.

Example 2

(Manufacturing Example of Piezoelectric Thin Film and Piezoelectric Element)

A piezoelectric thin film B1 was manufactured in the same manner as in Example 1 except that piezoelectric layers of first, second, third, fourth, and fifth layers were formed using the raw material solutions of Manufacturing Examples 6, 7, 8, 9, and 10 as raw material solutions. Particle shapes were observed, a film thickness was measured, and X-ray composition analysis and electron ray diffraction measurement were performed in the same manner as in Example 1.

The film thickness of the piezoelectric thin film B1 was 1450 nm (290 nm per layer). A Zr/Ti ratio of a portion in the vicinity of a substrate was 0.53/0.47, and a Zr/Ti ratio of a portion in the vicinity of a surface layer was 0.50/0.50. A fluctuation of y-value of the piezoelectric thin film B1 was 0.03. A (100) face had a tetragonal perovskite crystal structure oriented in a film thickness direction in any portion of the piezoelectric thin film B1.

Moreover, an equivalent circle diameter of each crystal grain of the piezoelectric thin film B1 was calculated using a scanning electronic microscope and image processing software, and a particle diameter distribution of crystal grains was obtained.

Figure 9:
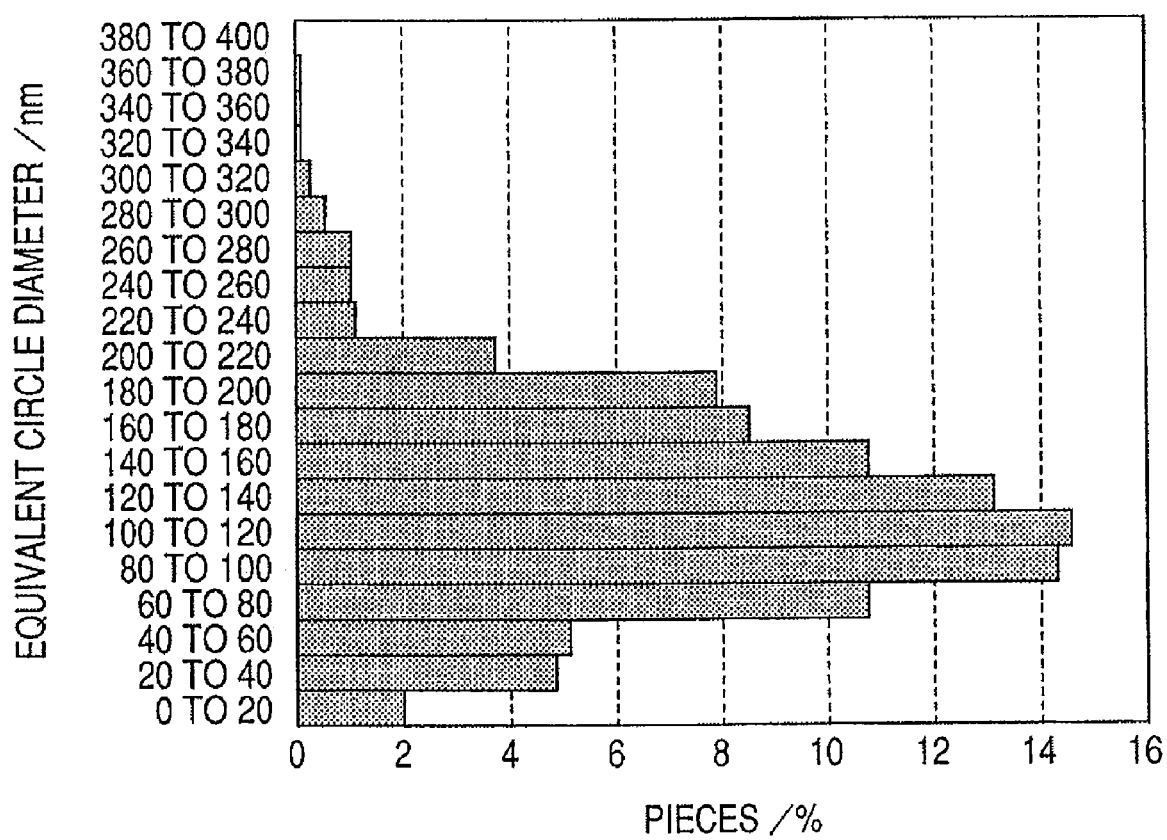
FIG. 9 is a graph showing an equivalent circle diameter distribution obtained by processing a crystal grain image of the surface of a piezoelectric thin film B1 of Example 2 by the scanning electronic microscope.

Obtained results are shown in FIG. 9. According to a measurement result of this particle diameter distribution, it was observed that crystal grains having an equivalent circle diameter of 200 nm or more existed by 8.0%, and crystal grains having an equivalent circle diameter of 40 nm or less existed by 6.9% in the surface layer. Equivalent circle diameters of all crystal grains were 1000 nm or less, and a peak of the distribution was in a range of 80 to 120 nm. Furthermore, it was confirmed that the crystal grains having the equivalent circle diameter of 200 nm or more were columnar crystals grown from the substrate.

Moreover, a piezoelectric element B2 was obtained in the same manner as in Example 1 except that the piezoelectric thin film B1 was used, and a dielectric constant and hysteresis were measured in the same manner as in Example 1. The piezoelectric element B2 had a specific dielectric constant of 1000 or more in a frequency region of 10 to 10000 Hz. A hysteresis curve peculiar in a ferroelectric member was observed according to hysteresis measurement, and a residual polarization value +Pr indicated 22 $\mu C/cm^2$ after a voltage of 15 V was applied.

Example 3

(Manufacturing Example of Piezoelectric Thin Film and Piezoelectric Element)

A piezoelectric thin film C1 was manufactured in the same manner as in Example 1 except that a single crystal substrate oriented in a (111) face comprising strontium titanate doped with 3.73 wt % of lanthanum as a conductive component was used (LSTO), and piezoelectric layers of first, second, third, fourth, and fifth layers were formed using the raw material solutions of Manufacturing Examples 11, 12, 13, 14, and 15 as raw material solutions. Particle shapes were observed, a film thickness was measured, and X-ray composition analysis and electron ray diffraction measurement were performed in the same manner as in Example 1.

The film thickness of the piezoelectric thin film C1 was 1400 nm (280 nm per layer). A Zr/Ti ratio of a portion in the vicinity of a substrate was 0.49/0.51, and a Zr/Ti ratio of a portion in the vicinity of a surface layer was 0.53/0.47. A fluctuation of y-value of the piezoelectric thin film C1 was 0.04. A (111) face had a rhombohedral perovskite crystal structure oriented in a film thickness direction in any portion of the piezoelectric thin film.

Additionally, it was observed that crystal grains having an equivalent circle diameter of 200 nm or more existed by 6%, and crystal grains having an equivalent circle diameter of 40 nm or less existed by 11% in the surface layer of the piezoelectric thin film C1. It was also confirmed that the crystal grains having an equivalent circle diameter of 200 nm or more were columnar crystals grown from the substrate.

Moreover, a piezoelectric element C2 was obtained using the piezoelectric thin film C1 in the same manner as in Example 1 except that a conductive substrate itself was used also as a lower electrode. When a dielectric constant and hysteresis were measured in the same manner as in Example 1, the piezoelectric element C2 had a specific dielectric constant of 700 or more in a frequency region of 10 to 10000 Hz. A hysteresis curve peculiar in a ferroelectric member was observed according to hysteresis measurement, and a residual polarization value +Pr indicated 38 $\mu C/cm^2$ after a voltage of 15 V was applied.

Example 4

(Manufacturing Example of Piezoelectric Thin Film and Piezoelectric Element)

A piezoelectric thin film D1 was manufactured in the same manner as in Example 1 except that the raw material solutions of Manufacturing Examples 2, 3, and 4 were used as raw material solutions, and piezoelectric layers were formed using the raw material solution of Manufacturing Example 2 in the piezoelectric layer of a first layer, using the raw material solution of Manufacturing Example 3 in piezoelectric layers of second, third, and fourth layers, and the raw material solution of Manufacturing Example 4 in the piezoelectric layer of the fifth layer. Particle shapes were observed, a film thickness was measured, and X-ray composition analysis and electron ray diffraction measurement were performed in the same manner as in Example 1.

The film thickness of the piezoelectric thin film D1 was 1250 nm (250 nm per layer). A Zr/Ti ratio of a portion in the vicinity of a substrate was 0.53/0.47, and a Zr/Ti ratio of a portion in the vicinity of a surface layer was 0.48/0.52. A fluctuation of y-value of the piezoelectric thin film D1 was 0.05. A (100) face had a tetragonal perovskite crystal structure oriented in a film thickness direction in any portion of the piezoelectric thin film D1.

Additionally, it was observed that crystal grains having an equivalent circle diameter of 200 nm or more existed by 5.0%, and crystal grains having an equivalent circle diameter of 40 nm or less existed by 5.0% in the surface layer of the piezoelectric thin film D1. It was also confirmed that the crystal grains having the equivalent circle diameter of 200 nm or more were columnar crystals grown from the substrate.

Moreover, a piezoelectric element D2 was obtained in the same manner as in Example 1 except that the piezoelectric thin film D1 was used, and a dielectric constant and hysteresis were measured in the same manner as in Example 1. The piezoelectric element D2 had a specific dielectric constant of 1000 or more in a frequency region of 10 to 10000 Hz. A hysteresis curve peculiar in a ferroelectric member was observed according to hysteresis measurement, and a residual polarization value +Pr indicated 29 $\mu C/cm^2$ after a voltage of 15 V was applied.

Comparative Example 1

(Manufacturing Example of Piezoelectric Thin Film and Piezoelectric Element)

A piezoelectric thin film R1 was manufactured in the same manner as in Example 1 except that 20 piezoelectric layers of first to twentieth layers were formed using the raw material solution of Manufacturing Example 16 as a raw material solution. Particle shapes were observed, a film thickness was measured, and X-ray composition analysis and electron ray diffraction measurement were performed in the same manner as in Example 1.

The film thickness of the piezoelectric thin film R1 was 1200 nm (60 nm per layer). A portion in the vicinity of a substrate had a rhombohedral perovskite crystal structure whose (111) face was oriented in a film thickness direction, and a Zr/Ti ratio was 0.62/0.38. On the other hand, a portion in the vicinity of a surface layer had a tetragonal perovskite crystal structure whose (100) face was oriented in a film thickness direction, and a Zr/Ti ratio was 0.51/0.49. Since an intermediate composition value was obtained in composition analysis in another portion, a fluctuation of y-value of the piezoelectric thin film R1 was judged as 0.11.

Additionally, it was observed that crystal grains having an equivalent circle diameter of 200 nm or more existed by 2%, and crystal grains having an equivalent circle diameter of 40 nm or less existed by 4% in the surface layer of the piezoelectric thin film R1.

Moreover, a piezoelectric element R2 was obtained in the same manner as in Example 1 except that the piezoelectric thin film R1 was used, and a dielectric constant and hysteresis were measured in the same manner as in Example 1. The piezoelectric element R2 had a specific dielectric constant of 500 to 700 in a frequency region of 10 to 10000 Hz. A hysteresis curve peculiar in a ferroelectric member was observed according to hysteresis measurement, and a residual polarization value +Pr indicated 10 $\mu C/cm^2$ after a voltage of 15 V was applied.

Example 5

(Example for Preparing Piezoelectric Element for Ink Jet System Recording Head)

Figure 5:
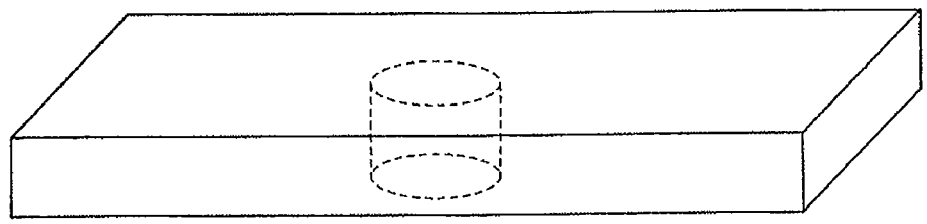
FIG. 5 is an enlarged perspective view schematically showing an example of a silicon wafer prepared in Example 5 whose part is removed and which is therefore designed in such a manner that a condition of a vibration can be observed.
Figure 6:
FIG. 6 is an enlarged longitudinal sectional view schematically showing an example of a silicon wafer prepared in Example 5 whose part is removed and which is therefore designed in such a manner that the condition of the vibration can be observed.
Figure 7:
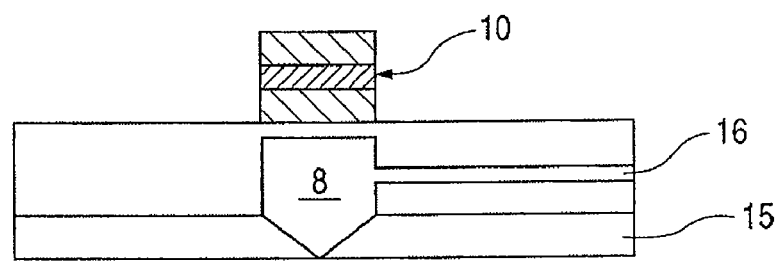
FIG. 7 is an enlarged vertical sectional view schematically showing a part of one example of an ink jet system recording head prepared in Example 6.
Figure 8:
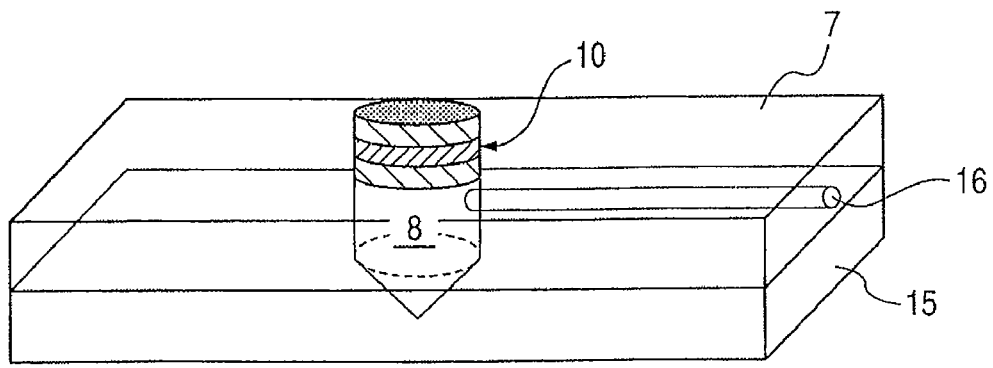
FIG. 8 is an enlarged perspective view schematically showing a part of one example of the ink jet system recording head prepared in Example 6.

To prepare an ink jet system recording head constituted as shown in FIGS. 7 and 8, a silicon layer of a substrate comprising the piezoelectric thin film A1 prepared in Example 1 was etched from a back surface (see FIGS. 5 and 6). The silicon layer was etched in a heated/stirred 22% aqueous solution of tetramethylammonium hydroxide. A portion whose silicon layer was etched and accordingly hollowed comprises layers of $SiO_2$/Ti/Pt/piezoelectric thin film A1, and an $SiO_2$ layer having a layer thickness of about 3 $\mu m$ performs a function of a vibration plate.

After performing the etching, a gold thin film layer was formed as an upper electrode layer on the layer of the piezoelectric thin film A1 by a sputtering process, and a piezoelectric element A3 of the present invention was prepared.

A voltage of 10 V was applied to the obtained piezoelectric element A3, a speed change detected by a Laser-Doppler speed measurement unit was integrated, and amplitude of the vibration plate of the piezoelectric element was obtained. Then, it was confirmed that vibration having amplitude of 1.4 to 1.6 $\mu m$ was imparted to the vibration plate in a frequency range of 1 to 10 kHz. This displacement was a sufficient displacement for discharging ink from the ink jet system recording head. When an applied voltage was reduced, displacement was also reduced, and it has been confirmed that a discharge amount can be controlled.

Example 6

(Example for Preparing Ink Jet System Recording Head)

A nozzle 15 shown in FIGS. 7 and 8 was attached to the piezoelectric element obtained in Example 5, and further an introducing tube 16 for introducing ink, and a head base 7 were attached to thereby prepare an ink jet system recording head. A discharge experiment was performed using this ink jet system recording head.

Ink for ink jet was introduced into the ink jet system recording head from the introducing tube 16 to thereby fill in a pressure chamber 8. Next, an alternating voltage of 1 to 20 kHz, 10 V was applied between upper and lower electrodes, and a condition of discharge of the ink was observed with a microscope. Accordingly, it has been confirmed that the ink jet system recording head follows each frequency, and discharges ink droplets. When an ink jet system recording head comprising a plurality of ink discharge ports was similarly prepared, it was possible to confirm that the ink was similarly discharged. Consequently, it has been confirmed that the ink jet system recording head using the piezoelectric element of Example 5 has a sufficient function of the ink jet system recording head.

This application claims priority from Japanese Patent Application No. 2004-055479 filed Feb. 27, 2004, which is hereby incorporated by reference herein.

The invention claimed is:

1. A method of manufacturing a piezoelectric thin film of perovskite crystals represented by a general formula $Pb_{(1-x)}La_x(Zr_yTi_{1-y})O_3$ (where $0 \leq x < 1$, $0.05 \leq y \leq 1$) and manufactured from a plurality of piezoelectric layers, wherein a surface of the piezoelectric thin film includes crystal grains having an equivalent circle diameter of 200 nm or more and crystal grains having an equivalent circle diameter of 40 nm or less, and a number of the crystal grains observed in the surface of the piezoelectric thin film and having the equivalent circle diameter of 40 nm or less is 5% or more with respect to a total number of the crystal grains observed in the surface of the piezoelectric thin film, the method comprising the steps in a following order of:
  (a) a first step of providing a first raw material solution containing titanium, zirconium, and lead on a substrate to thereby form a first coating layer;
  (b) a second step of firing the first coating layer at a temperature of 400° C. or more and 700° C. or less to thereby form a first piezoelectric layer having a layer thickness of 150 nm or more and 400 nm or less;
  (c) a third step of providing a second raw material solution containing titanium, zirconium, and lead on the first piezoelectric layer to thereby form a second coating layer; and
  (d) a fourth step of firing the second coating layer at a temperature of 400° C. or more and 700° C. or less to thereby form a second piezoelectric layer having a layer thickness of 150 nm or more and 400 nm or less,
  wherein a titanium concentration in the first step of providing the first raw material solution is higher than a titanium concentration in the third step of providing the second raw material solution, and
  wherein a difference between a maximum value and a minimum value of y in an arbitrary portion of the piezoelectric thin film is 0.05 or less.

2. The method of manufacturing the piezoelectric thin film according to claim 1, comprising repeating steps of providing a raw material solution on the substrate to form a coating layer and firing the coating layer three times or more and ten times or less to thereby form the piezoelectric thin film in which the plurality of piezoelectric layers are stacked.

3. The method of manufacturing the piezoelectric thin film according to claim 1, wherein at least one of the first and second raw material solutions contains 1,8-diazabicyclo[5.4.0]-7-undecene, 1,5-diazabicyclo[4.3.0]non-5-en, or 1,4-diazabicyclo[2.2.2]octane as a stabilizer.

4. A method of manufacturing the piezoelectric thin film according to claim 1, wherein a tetragonal crystal system is formed in an arbitrary portion of the piezoelectric thin film.

5. A method of manufacturing the piezoelectric thin film according to claim 1, wherein a rhombohedral crystal system is formed in an arbitrary portion of the piezoelectric thin film.

* * * * *